(12) United States Patent
Matsubara

(10) Patent No.: US 8,791,741 B2
(45) Date of Patent: Jul. 29, 2014

(54) ADJUSTMENT APPARATUS, ADJUSTMENT METHOD AND TEST APPARATUS

(75) Inventor: Yasuo Matsubara, Saitama (JP)

(73) Assignee: Advantest Corporation, Tokyo (JP)

( * ) Notice: Subject to any disclaimer, the term of this patent is extended or adjusted under 35 U.S.C. 154(b) by 1147 days.

(21) Appl. No.: 12/756,866

(22) Filed: Apr. 8, 2010

(65) Prior Publication Data

US 2010/0271093 A1 Oct. 28, 2010

(30) Foreign Application Priority Data

Apr. 22, 2009 (JP) ................................. 2009-104469

(51) Int. Cl.
*G06F 1/04* (2006.01)
*G06F 1/10* (2006.01)

(52) U.S. Cl.
CPC ........................................ *G06F 1/10* (2013.01)
USPC ........................................................ 327/291

(58) Field of Classification Search
USPC .................................. 327/172–176, 291–299
See application file for complete search history.

(56) References Cited

U.S. PATENT DOCUMENTS

| 6,184,672 | B1 * | 2/2001 | Berkcan .................... 324/117 R |
| 7,612,620 | B2 * | 11/2009 | Rausch et al. .................. 331/45 |
| 7,733,194 | B2 * | 6/2010 | Lan et al. ......................... 333/20 |
| 8,018,261 | B2 * | 9/2011 | Becker et al. .................. 327/175 |
| 8,148,996 | B2 * | 4/2012 | Teng et al. ..................... 324/537 |

FOREIGN PATENT DOCUMENTS

| JP | 2003-43124 A | 2/2003 |
| JP | 2006105636 | 4/2006 |

OTHER PUBLICATIONS

JP Office Action/Search Report and Computer Translation Dated Nov. 20, 2012; Application No.: 2009104469.

* cited by examiner

*Primary Examiner* — Sibin Chen

(57) ABSTRACT

Provided is an adjustment apparatus that adjusts signal output timings, comprising a control section that causes a first signal output section to output a signal having a rising edge and causes a second signal output section to output a signal having a falling edge; a signal acquiring section that acquires a composite signal obtained by combining the signal output by the first signal output section and the signal output by the second signal output section; and an adjusting section that adjusts a timing difference between a signal output timing of the first signal output section and a signal output timing of the second signal output section, such that the signal acquiring section acquires the composite signal having a composite waveform in which the rising edge and the falling edge overlap.

9 Claims, 15 Drawing Sheets

US 8,791,741 B2

ADJUSTMENT APPARATUS, ADJUSTMENT METHOD AND TEST APPARATUS

BACKGROUND

1. Technical Field

The present invention relates to an adjustment apparatus, an adjustment method, and a test apparatus for adjusting signal output timing.

2. Related Art

A test apparatus for testing a semiconductor apparatus outputs a signal having a designated waveform to the device under test at a designated timing. Prior to testing, the test apparatus adjusts the signal output timing of the driver so as to enable accurate output of the waveform at the designated timing, as shown in Patent Document 1, for example. When outputting a differential signal, the test apparatus adjusts the signal output timing between a positive driver and a negative driver.

Patent Document 1: Japanese Patent Application Publication No. 2003-43124

When adjusting the signal output timing between the positive driver and the negative driver, the positive driver and the negative driver are both connected to a single comparator. The timing adjustment is performed by acquiring both the rising edge output from the positive driver and the falling edge output from the negative driver at the same timing by the one comparator.

However, the rising response and the falling response of comparators usually are not the same. As a result, when performing adjustment in the manner described above, the time difference between the rising response and the falling response of the comparator becomes a skew between the signal output timing of the positive driver and the signal output timing of the negative driver. Therefore, in order to accurately adjust the timing between the positive driver and the negative driver, a high-precision comparator must be used.

SUMMARY

In order to solve the above problems, according to a first aspect related to the innovations herein, one exemplary adjustment apparatus may include an adjustment apparatus that adjusts signal output timings, comprising a control section that causes a first signal output section to output a signal having a rising edge and causes a second signal output section to output a signal having a falling edge; a signal acquiring section that acquires a composite signal obtained by combining the signal output by the first signal output section and the signal output by the second signal output section; and an adjusting section that adjusts a timing difference between a signal output timing of the first signal output section and a signal output timing of the second signal output section, such that the signal acquiring section acquires the composite signal having a composite waveform in which the rising edge and the falling edge overlap. Also provided is an adjustment method using the adjustment apparatus.

According to a second aspect related to the innovations herein, one exemplary test apparatus may include a test apparatus that tests a device under test, comprising a first signal output section and a second signal output section that each output a signal for testing the device under test; and the adjustment apparatus according to the first aspect.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
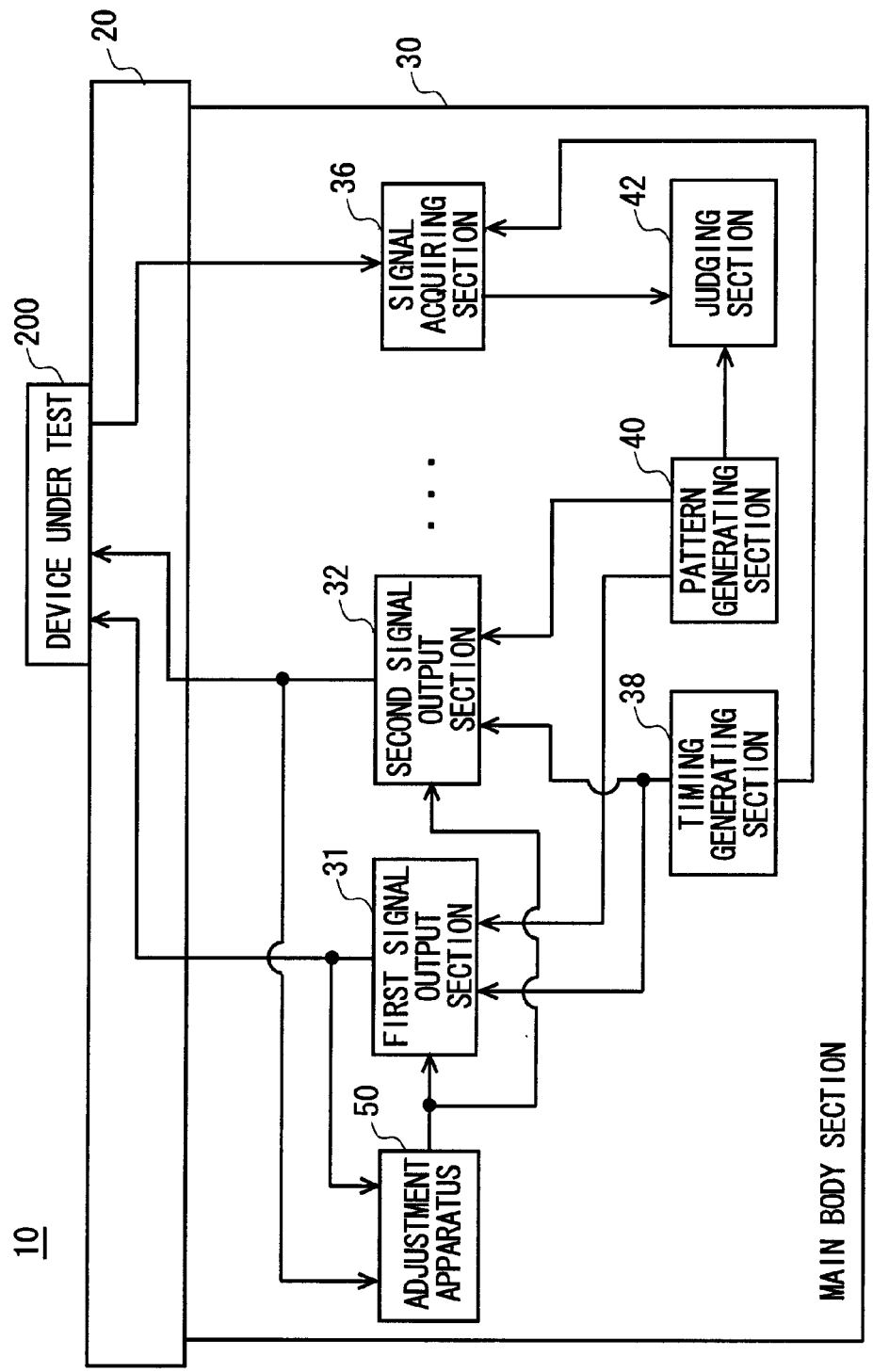
FIG. 1 shows a functional configuration of a test apparatus 10 according to an embodiment of the present invention, along with a device under test 200.

FIG. 1 shows a functional configuration of a test apparatus 10 according to an embodiment of the present invention, along with a device under test 200. The test apparatus 10 tests the device under test 200. The test apparatus 10 includes a device loading section 20 and a main body section 30.

The device under test 200 is loaded on the device loading section 20. The device loading section 20 has wiring for connecting the main body section 30 to the device under test 200. The device loading section 20 may be a motherboard and a socket board, for example.

The main body section 30 may include a first signal output section 31, a second signal output section 32, a signal acquiring section 36, a timing generating section 38, a pattern generating section 40, a judging section 42, and an adjustment apparatus 50. The first signal output section 31 and the second signal output section 32 each output a test signal for testing the device under test 200. The main body section 30 may include a signal output section in addition to the first signal output section 31 and the second signal output section 32.

The signal acquiring section 36 acquires a response signal output by the device under test 200 in response to a test signal. The main body section 30 may include a plurality of signal acquiring sections 36.

The timing generating section 38 supplies the first signal output section 31 and the second signal output section 32 with a timing signal that designates an output timing of the test signals. The timing generating section 38 supplies the signal acquiring section 36 with a strobe signal that designates an acquisition timing of the response signal. The main body section 30 may include a plurality of timing generating sections 38.

The pattern generating section 40 supplies the first signal output section 31 and the second signal output section 32 with a pattern that designates waveforms of the test signals. The pattern generating section 40 generates an expected value for the response signal. The judging section 42 judges whether the logic value of the response signal of the device under test 200 acquired by the signal acquiring section 36 matches the expected value of the response signal generated by the pattern generating section 40. The main body section 30 may include a plurality of pattern generating sections 40 and a plurality of judging sections 42.

The adjustment apparatus 50 adjusts the signal output timings of the first signal output section 31 and the second signal output section 32 such that the signals are output at the same timing. The adjustment apparatus 50 may perform this adjustment prior to testing or periodically at constant intervals.

Figure 2:
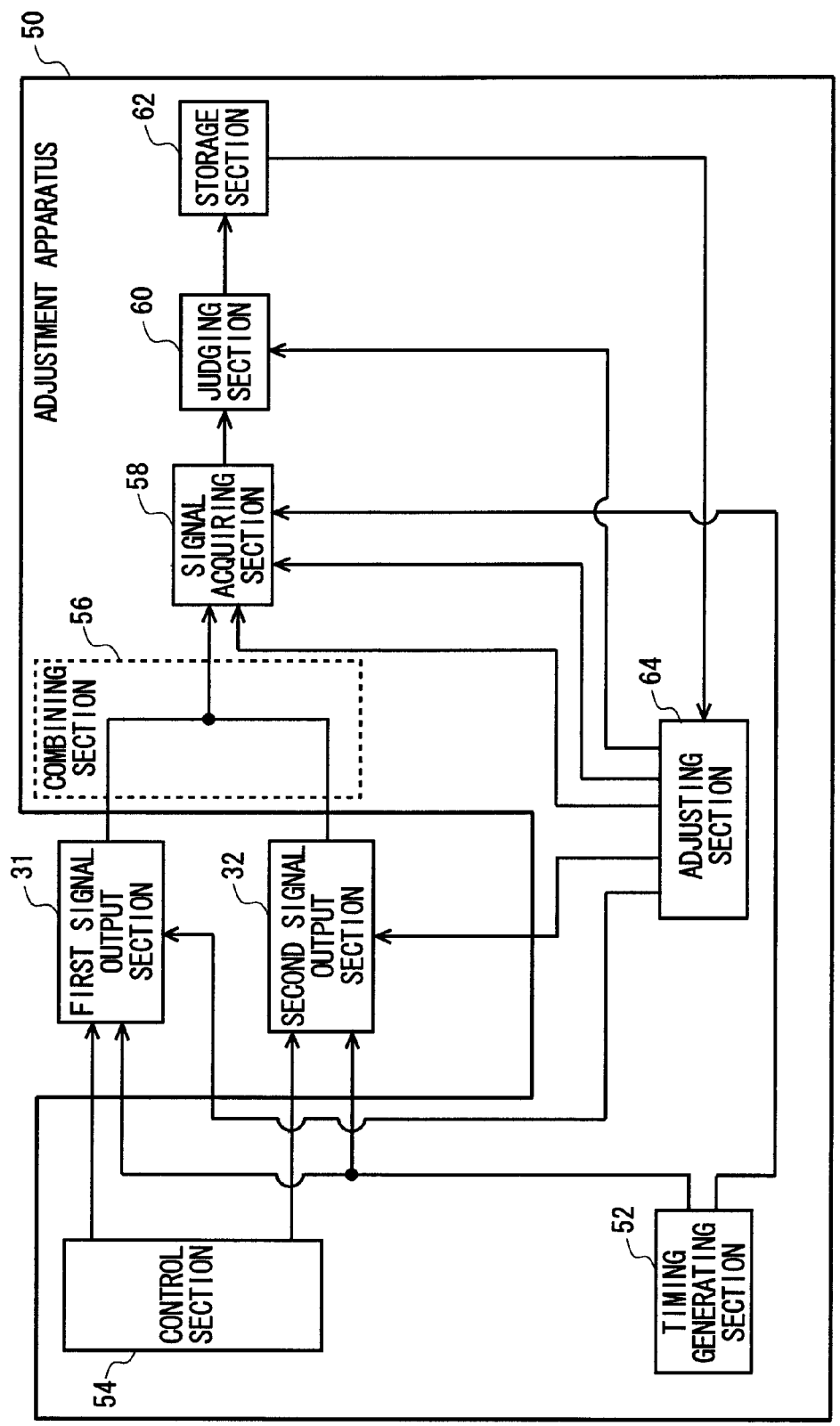
FIG. 2 shows a configuration of the adjustment apparatus 50 according to the present embodiment.

FIG. 2 shows a configuration of the adjustment apparatus 50 according to the present embodiment. The adjustment apparatus 50 includes a timing generating section 52, a control section 54, a combining section 56, a signal acquiring section 58, a judging section 60, a storage section 62, and an adjusting section 64.

The timing generating section 52 outputs a timing signal that designates the output timings of the first signal output section 31 and the second signal output section 32. The timing generating section 52 also outputs a strobe signal that designates the signal acquisition timing of the signal acquiring section 58. The timing generating section 52 may be implemented as a timing generating section 38 provided within the main body section 30 of the test apparatus 10.

The control section 54 supplies a pattern for designating a waveform to each of the first signal output section 31 and the second signal output section 32, thereby causing the first signal output section 31 to output a signal having a rising edge and causing the second signal output section 32 to output a signal having a falling edge. In other words, the control section 54 causes the first signal output section 31 to output a signal whose waveform changes from logic L to logic H, and causes the second signal output section 32 to output a signal whose waveform changes from logic H to logic L.

The control section 54 supplies the first signal output section 31 and the second signal output section 32 with patterns that cause the signal having the rising edge and the signal having the falling edge to be output at the same timing. The control section 54 may be implemented as a pattern generating section 40 provided in the main body section 30 of the test apparatus 10.

The combining section 56 outputs a composite signal obtained by combining the signal output from the first signal output section 31 and the signal output from the second signal output section 32. The combining section 56 may include a first signal line that propagates the signal output by the first signal output section 31, a second signal line that propagates the signal output by the second signal output section 32, and a third signal line that outputs the composite signal to the outside from a junction between the first signal line and the second signal line. The combining section 56 may be circuitry formed on a calibration board or the like and mounted on the main body section 30 instead of the device loading section 20.

The signal acquiring section 58 acquires a logic value of the composite signal output from the combining section 56. The signal acquiring section 58 may be implemented as a signal acquiring section 36 provided in the main body section 30 of the test apparatus 10.

The signal acquiring section 58 may acquire the logic value of the composite signal at a plurality of different timings. The signal acquiring section 58 may acquire the logic value of the composite signal by comparing the composite signal to a plurality of different threshold values. In other words, the signal acquiring section 58 may acquire the logic value of the composite signal by comparing the composite signal to each of the threshold values at each of the plurality of timings.

The judging section 60 judges whether the logic value acquired by the signal acquiring section 58 matches a prescribed logic value. The judging section 60 outputs a PASS when the logic value acquired by the signal acquiring section 58 matches the prescribed logic value, and outputs a FAIL when the logic value acquired by the signal acquiring section 58 does not match the prescribed logic value. The judging section 60 may be implemented as a judging section 42 provided in the main body section 30 of the test apparatus 10.

The storage section 62 stores the judgment results of the judging section 60. For example, the storage section 62 stores judgment results for a plurality of logic values obtained as a result of the comparison to the threshold values at the plurality of timings.

The adjusting section 64 adjusts a timing difference between the signal output timing of the first signal output section 31 and the signal output timing of the second signal output section 32, such that the signal acquiring section 58 acquires the composite signal having a composite waveform in which the rising edge and the falling edge overlap. The adjusting section 64 may judge whether a composite signal having a composite waveform in which the rising edge and the falling edge overlap is acquired based on the logic value of the composite signal acquired at each of the plurality of timings. Instead, the adjusting section 64 may judge whether a composite signal having a composite waveform in which the rising edge and the falling edge overlap is acquired based on the logic value of the composite signal obtained by comparing the composite signal to the plurality of threshold values.

Figure 3:
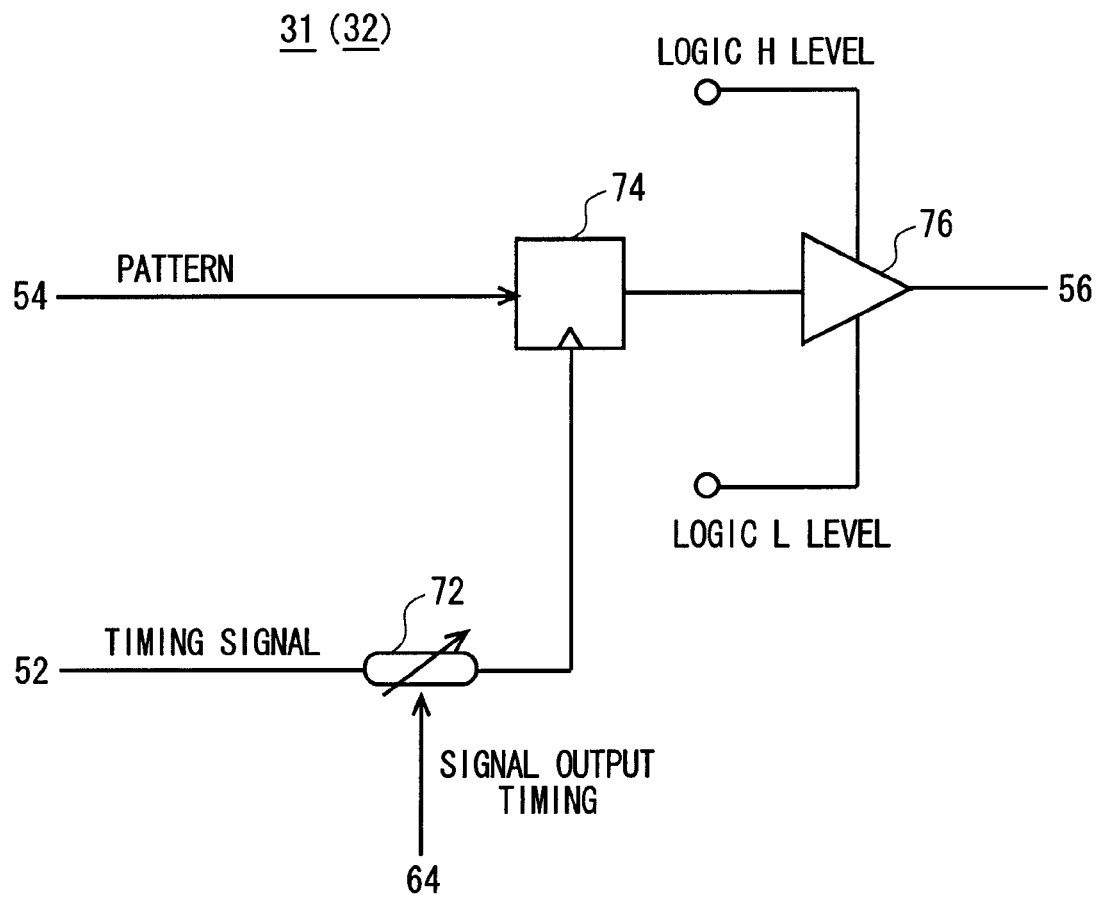
FIG. 3 shows an exemplary configuration of the first signal output section 31.

FIG. 3 shows an exemplary configuration of the first signal output section 31. The second signal output section 32 has the same configuration as the first signal output section 31, and therefore a separate description is not provided.

The first signal output section 31 may include a timing adjustment circuit 72, a flip-flop circuit 74, and a drive circuit 76. The timing adjustment circuit 72 delays the timing signal supplied from the timing generating section 52. The flip-flop circuit 74 receives a logic value corresponding to the pattern generated by the control section 54. The flip-flop circuit 74 outputs the acquired logic value at a timing designated by the timing signal delayed by the timing adjustment circuit 72.

The drive circuit 76 supplies the combining section 56 with a signal whose level corresponds to the logic value output by the flip-flop circuit 74. For example, when a signal having Logic H is supplied from the flip-flop circuit 74, the drive circuit 76 outputs a signal whose voltage level is logic H. Furthermore, when a signal having Logic L is supplied from the flip-flop circuit 74, the drive circuit 76 outputs a signal whose voltage level is logic L.

Here, the delay amount of the timing adjustment circuit 72 is adjusted by the adjusting section 64. When the delay amount of the timing adjustment circuit 72 changes, the timing at which the timing signal is supplied to the flip-flop circuit 74 also changes. In this way, the adjusting section 64 can adjust the signal output timing of the first signal output section 31.

Figure 4:
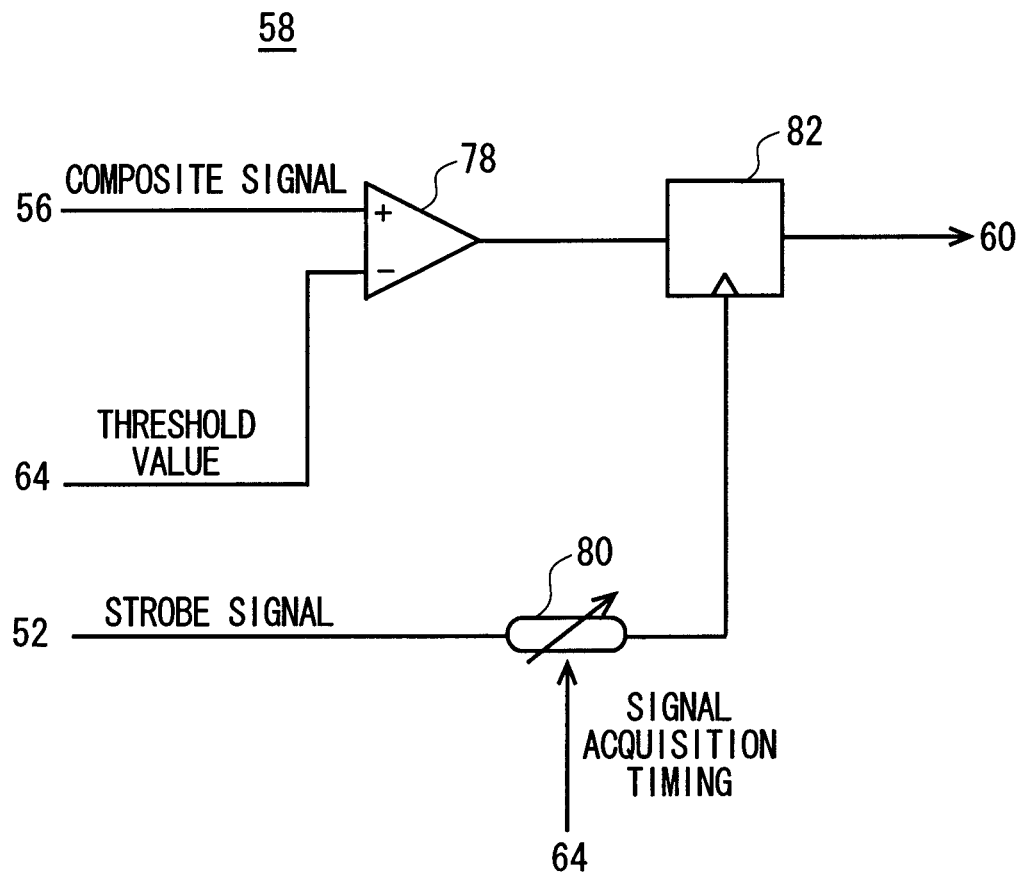
FIG. 4 shows an exemplary configuration of the signal acquiring section 58.

FIG. 4 shows an exemplary configuration of the signal acquiring section 58. The signal acquiring section 58 may include a level comparator circuit 78, a timing adjustment circuit 80, and a timing comparator circuit 82.

The level comparator circuit 78 receives the composite signal from the combining section 56 and outputs the logic value of the composite signal. The timing adjustment circuit 80 delays the strobe signal supplied from the timing generating section 52. The timing comparator circuit 82 acquires the logic value from the level comparator circuit 78 at a timing according to the strobe signal delayed by the timing adjustment circuit 80. The timing comparator circuit 82 outputs the acquired logic value to the judging section 60.

The level comparator circuit 78 may receive a threshold value from the adjusting section 64. The level comparator circuit 78 determines the logic value of the composite signal according to the supplied threshold value. For example, the level comparator circuit 78 may output a signal having logic H if the voltage of the composite signal is greater than or equal to the threshold value, and may output logic L if the voltage of the composite signal is less than the threshold value.

Here, the delay amount of the timing adjustment circuit 80 is adjusted by the adjusting section 64. When the delay amount of the timing adjustment circuit 80 changes, the timing at which the strobe signal is supplied to the timing comparator circuit 82 also changes. In this way, the adjusting section 64 can adjust the composite signal acquisition timing of the signal acquiring section 58.

The signal acquiring section 58 may be a multi-strobe circuit that acquires the logic value of the composite signal at a plurality of different timings. Specifically, the signal acquiring section 58 may include a plurality of timing adjustment circuits 80 and a plurality of timing comparator circuits 82. The timing adjustment circuits 80 each delay the strobe signal by a different amount. The timing comparator circuits 82 each acquire the logic value from the level comparator circuit 78 at a timing of the strobe signal delayed by a corresponding timing adjustment circuit 80.

Figure 5:
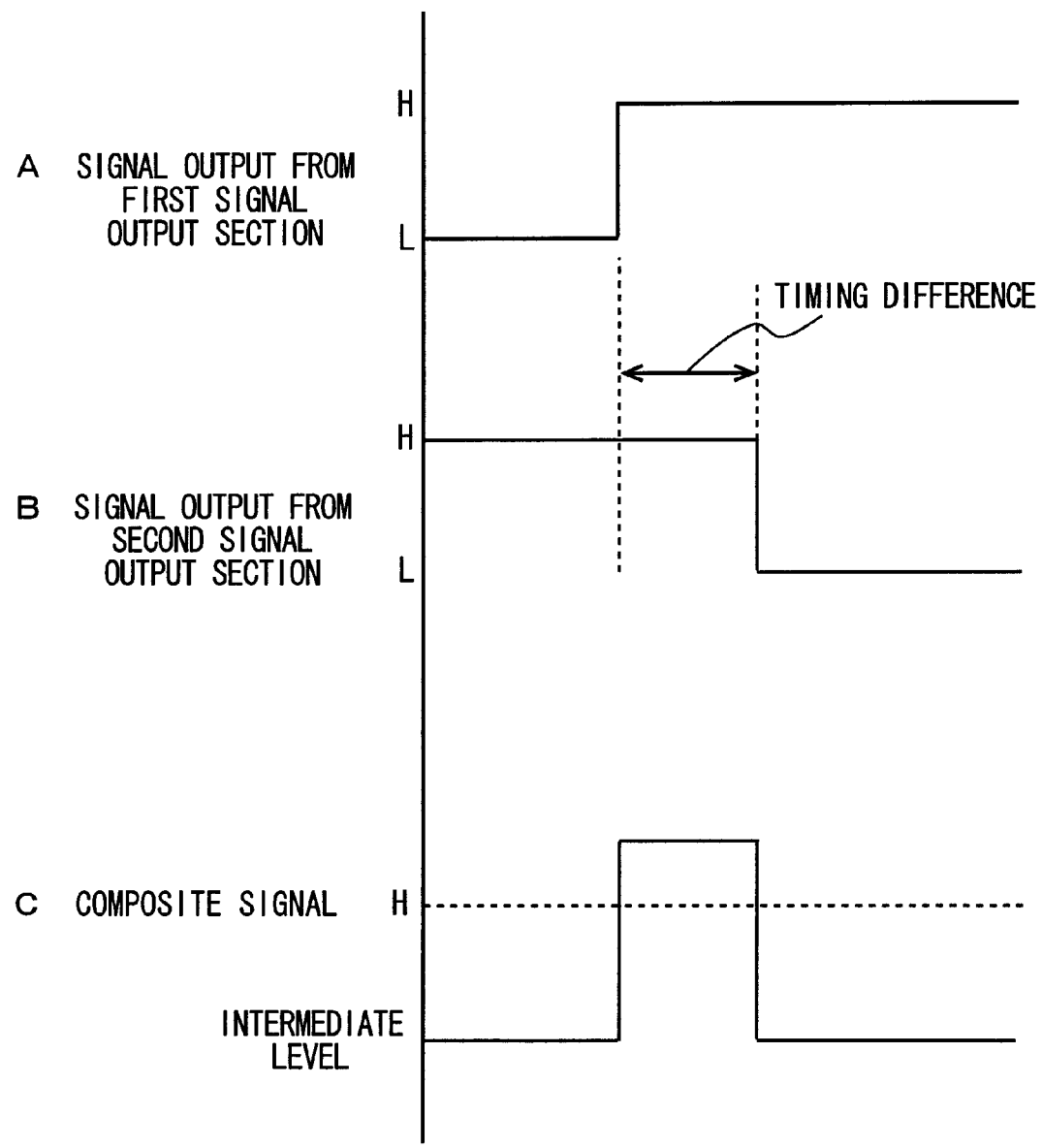
FIG. 5 shows exemplary waveforms occurring when the signal output timing of the first signal output section 31 is earlier than the signal output timing of the second signal output section 32.
Figure 6:
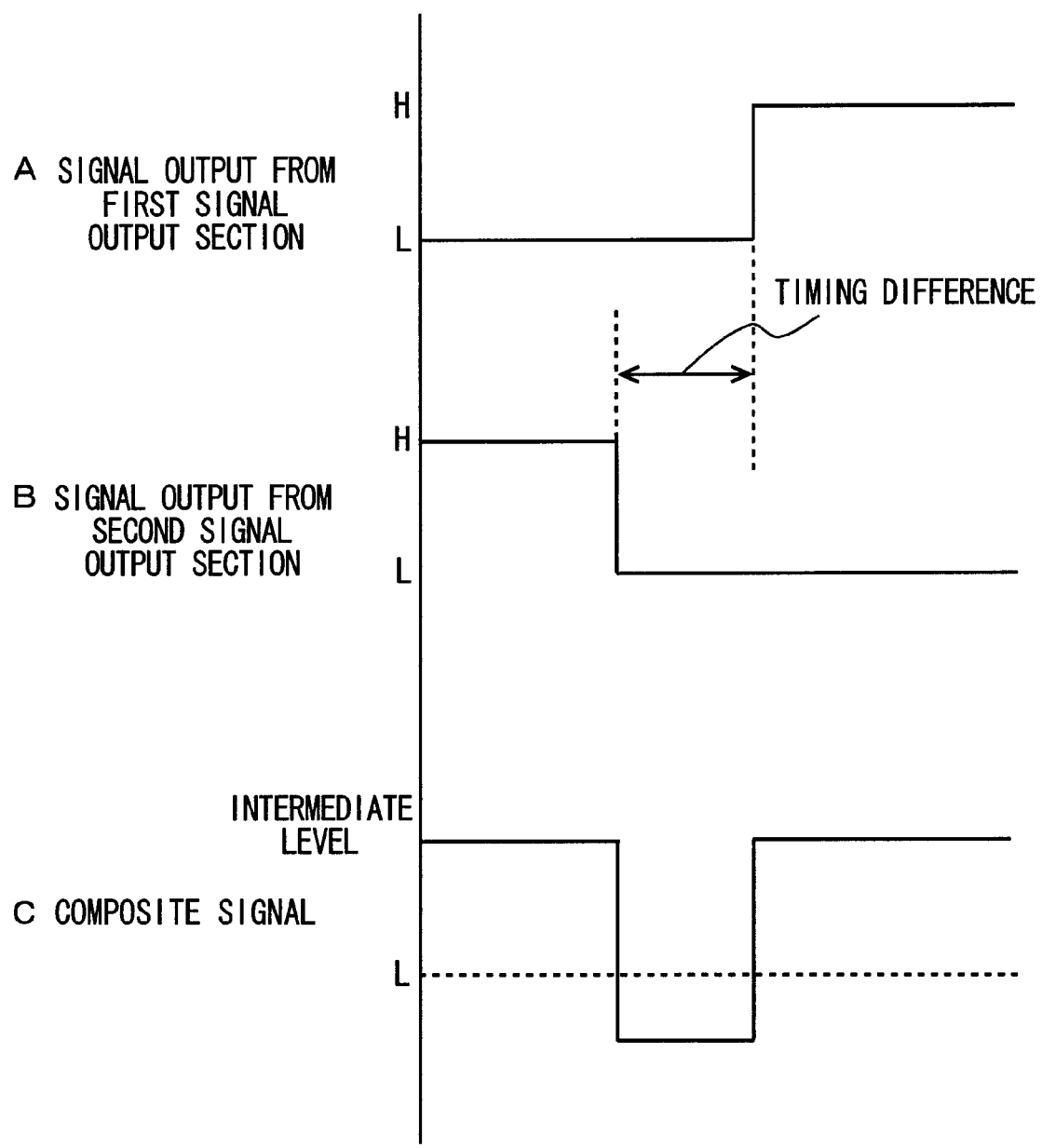
FIG. 6 shows exemplary waveforms occurring when the signal output timing of the second signal output section 32 is earlier than the signal output timing of the first signal output section 31.

FIG. 5 shows exemplary waveforms occurring when the signal output timing of the first signal output section 31 is earlier than the signal output timing of the second signal output section 32. FIG. 6 shows exemplary waveforms occurring when the signal output timing of the second signal output section 32 is earlier than the signal output timing of the first signal output section 31.

As shown by A in FIGS. 5 and 6, the first signal output section 31 outputs a signal having a rising edge at which the logic value changes from L to H. As shown by B in FIGS. 5 and 6, the second signal output section 32 outputs a signal having a falling edge at which the logic value changes from H to L.

As shown by C in FIGS. 5 and 6, in a period during which the first signal output section 31 outputs a logic L signal and the second signal output section 32 outputs a logic H signal, the combining section 56 outputs the composite signal at an intermediate level, which is a level that is halfway between the logic H level and the logic L level. Furthermore, in a period during which the first signal output section 31 outputs a logic H signal and the second signal output section 32 outputs a logic L signal, the combining section 56 outputs the composite signal at the intermediate level.

As shown by C in FIG. 5, when the signal output timing of the second signal output section 32 is later than that of the first signal output section 31, the combining section 56 outputs the composite signal with a level that is higher than the logic H level during a period from the rising edge of the signal output by the first signal output section 31 to the falling edge of the signal output by the second signal output section 32. As shown by C in FIG. 6, when the signal output timing of the first signal output section 31 is later than that of the second signal output section 32, the combining section 56 outputs the composite signal with a level that is lower than the logic L level during a period from the falling edge of the signal output by the second signal output section to the rising edge of the signal output by the first signal output section 31.

Figure 7:
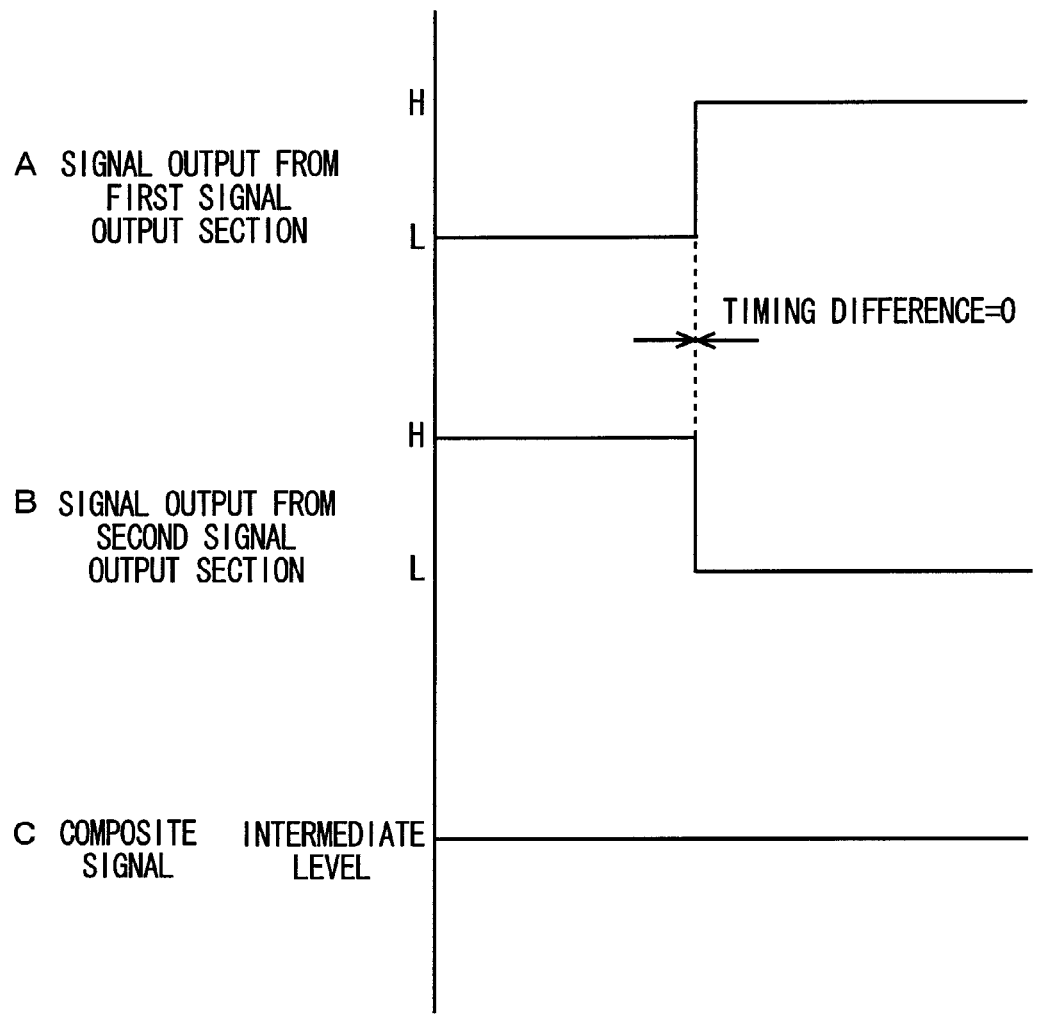
FIG. 7 shows exemplary waveforms occurring when the signal output timings of the first signal output section 31 and the second signal output section 32 are the same.

FIG. 7 shows exemplary waveforms occurring when the signal output timings of the first signal output section 31 and the second signal output section 32 are the same. As shown by A and B in FIG. 7, when the signal output timings of the first signal output section 31 and the second signal output section 32 are the same, the rising edge of the signal output by the first signal output section 31 and the falling edge of the signal output by the second signal output section 32 overlap. In other words, the timing difference between the rising edge of the signal output by the first signal output section 31 and the falling edge of the signal output by the second signal output section 32 is zero.

In such a case, the combining section 56 outputs the composite signal at the intermediate level for all timings. In the present embodiment, the adjusting section 64 adjusts the timing difference between the signal output timing of the first signal output section 31 and the signal output timing of the second signal output section 32 such that the composite signal is output at the intermediate level at all timings. Therefore, the adjusting section 64 can adjust the timing difference between the signal output timing of the first signal output section 31 and the signal output timing of the second signal output section 32 such that the signal acquiring section 58 acquires the composite signal having a composite waveform in which the rising edge and the falling edge overlap.

Figure 8:
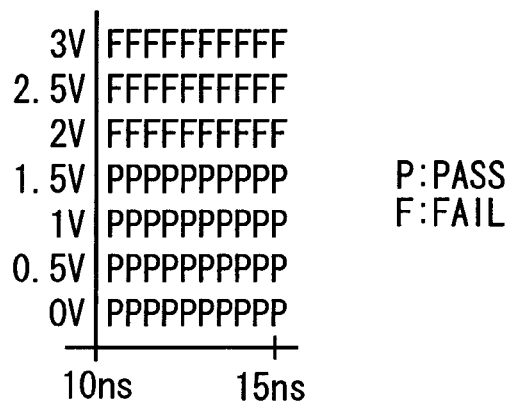
FIG. 8 shows exemplary judgment results (shmoo plot) of logic values of the composite signal acquired by comparing the composite signal to each of a plurality of threshold values at a plurality of timings.

FIG. 8 shows exemplary judgment results (shmoo plot) of logic values of the composite signal acquired by comparing the composite signal to each of a plurality of threshold values at a plurality of timings. In FIG. 8, the judgment result is P (PASS) when the logic value of the acquired composite signal is H, and the judgment result is F (FAIL) when the logic value of the acquired composite signal is not H. The same convention is used for FIGS. 9 to 11.

With the signal output timings of the first signal output section 31 and the second signal output section 32 each set to a certain timing, the signal acquiring section 58 obtains the logic value of the composite signal by comparing the logic signal to the threshold values. In the example of FIG. 8, the signal acquiring section 58 acquires the logic value by comparing the composite signal to threshold values that are set at intervals of 0.5 V within a range from 0 V to 3 V.

Furthermore, with the signal output timings of the first signal output section 31 and the second signal output section 32 each set to a certain timing, the signal acquiring section 58 obtains the logic value of the composite signal at a plurality of timings. In the example of FIG. 8, the signal acquiring section 58 acquires the logic value of the composite signal at timings at 0.5 ns intervals in a range of 10 ns to 15 ns from a reference phase.

Here, when the composite signal is compared with each of the threshold values at the designated intervals within the prescribed level range at each of the timings at the designated intervals within the prescribed timing range, the adjusting section 64 can acquire comparison results at a prescribed number of points. For example, in the example of FIG. 8, seven threshold values are set in the level range and ten timings are set in the time range, and so the adjusting section 64 can acquire judgment results at 70 points.

Figure 9:
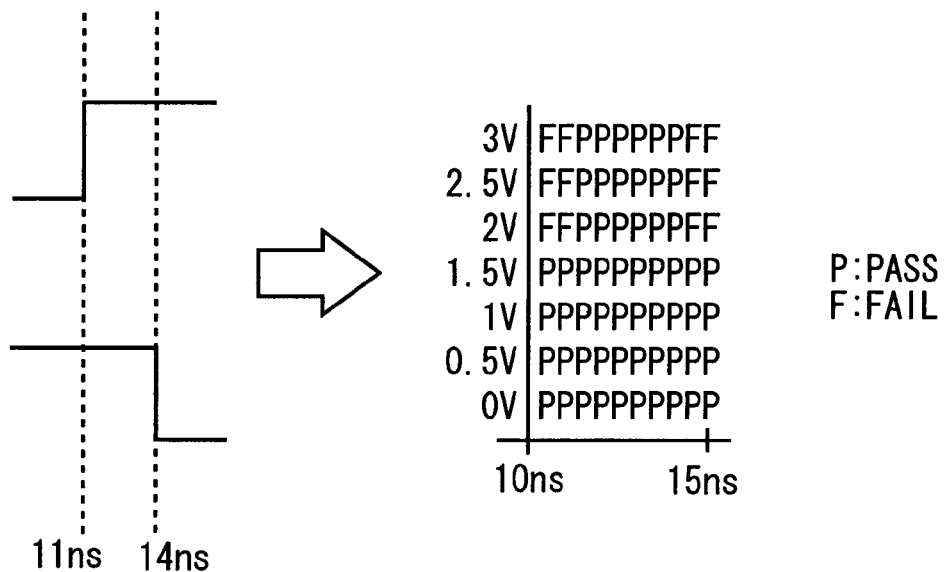
FIG. 9 shows judgment results (shmoo plot) obtained when the signal output timing of the first signal output section 31 is earlier than that of the second signal output section 32.
Figure 10:
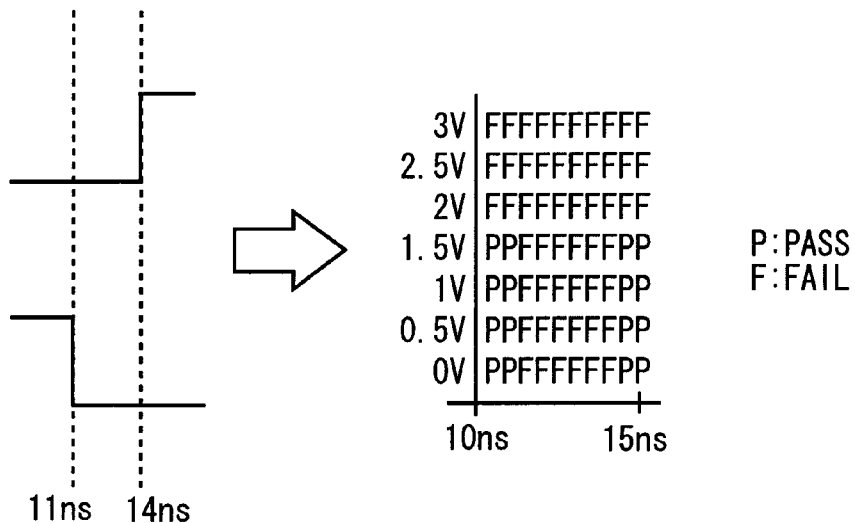
FIG. 10 shows judgment results (shmoo plot) obtained when the signal output timing of the second signal output section 32 is earlier than that of the first signal output section 31.

FIG. 9 shows judgment results (shmoo plot) obtained when the signal output timing of the first signal output section 31 is earlier than that of the second signal output section 32. FIG. 10 shows judgment results (shmoo plot) obtained when the signal output timing of the second signal output section 32 is earlier than that of the first signal output section 31.

As shown in FIG. 9, when the signal output timing of the first signal output section 31 is earlier than that of the second signal output section 32, the composite signal includes a period during which the level is higher than the logic H level. Accordingly, during this period, the number of points indicating PASS is greater than during other periods.

As shown in FIG. 10, when the signal output timing of the second signal output section 32 is earlier than that of the first signal output section 31, the composite signal includes a period during which the level is lower than the logic L level. Accordingly, during this period, the number of points indicating FAIL is greater than during other periods.

Figure 11:
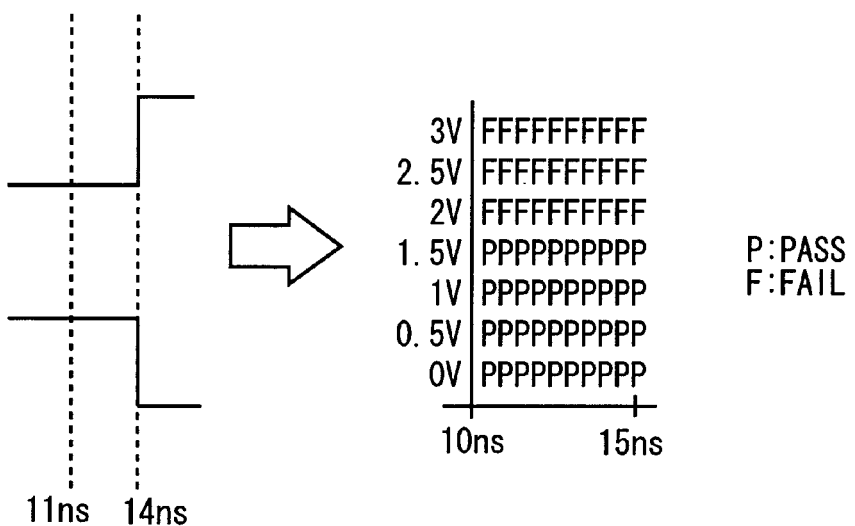
FIG. 11 shows judgment results (shmoo plot) obtained when the signal output timings of the first signal output section 31 and the second signal output section 32 are the same.

FIG. 11 shows judgment results (shmoo plot) obtained when the signal output timings of the first signal output section 31 and the second signal output section 32 are the same. When the signal output timings of the first signal output section 31 and the second signal output section 32 are the same, the combining section 56 outputs the composite signal having a composite waveform in which the rising edge and the falling edge overlap. This composite signal having a composite waveform in which the rising edge and the falling edge overlap is at the intermediate level for all periods.

As a result, as shown in FIG. 11, when the signal output timings of the first signal output section 31 and the second signal output section 32 are the same, the number of points indicating PASS is the same over all periods. Accordingly, when this composite signal is compared to each of the threshold values at the designated intervals within the prescribed level range at each of the timings at the designated intervals within the prescribed timing range, the adjusting section 64 can acquire a prescribed number of points of judgment results indicating a prescribed logic value.

From among the logic values acquired by comparing the logic value of composite signal to each of the threshold values at the designated intervals within the prescribed level range at each of the timings at the designated intervals within the prescribed timing range, the adjusting section 64 can detect the number of points that indicate the prescribed logic value. The adjusting section 64 then adjusts the timing difference between the output timings of the first signal output section 31 and the second signal output section 32 such that the number of points becomes a predetermined set number.

The adjusting section 64 may set the set number to be the number of points indicating a prescribed logic value when the composite signal having the intermediate level between the logic H level and the logic L level is compared to the plurality of threshold values at the plurality of timings. For example, in FIG. 11, the logic L level is 0 V, the logic H level is 3 V, and the intermediate level between is 1.5 V. Accordingly, in this example, the adjusting section 64 sets the set number to be 40 points. The adjusting section 64 adjusts the timing difference between the signal output timings of the first signal output section 31 and the second signal output section 32 such that the number of points indicating logic H, i.e. the number of points indicating PASS, is 40, which is the set number.

Since this adjusting section 64 adjusts the number of points indicating the prescribed logic value, i.e. the number of points indicating PASS, to be a set number, it is easy to judge whether a composite signal is received having a composite waveform in which the rising edge and the falling edge overlap.

Figure 12:
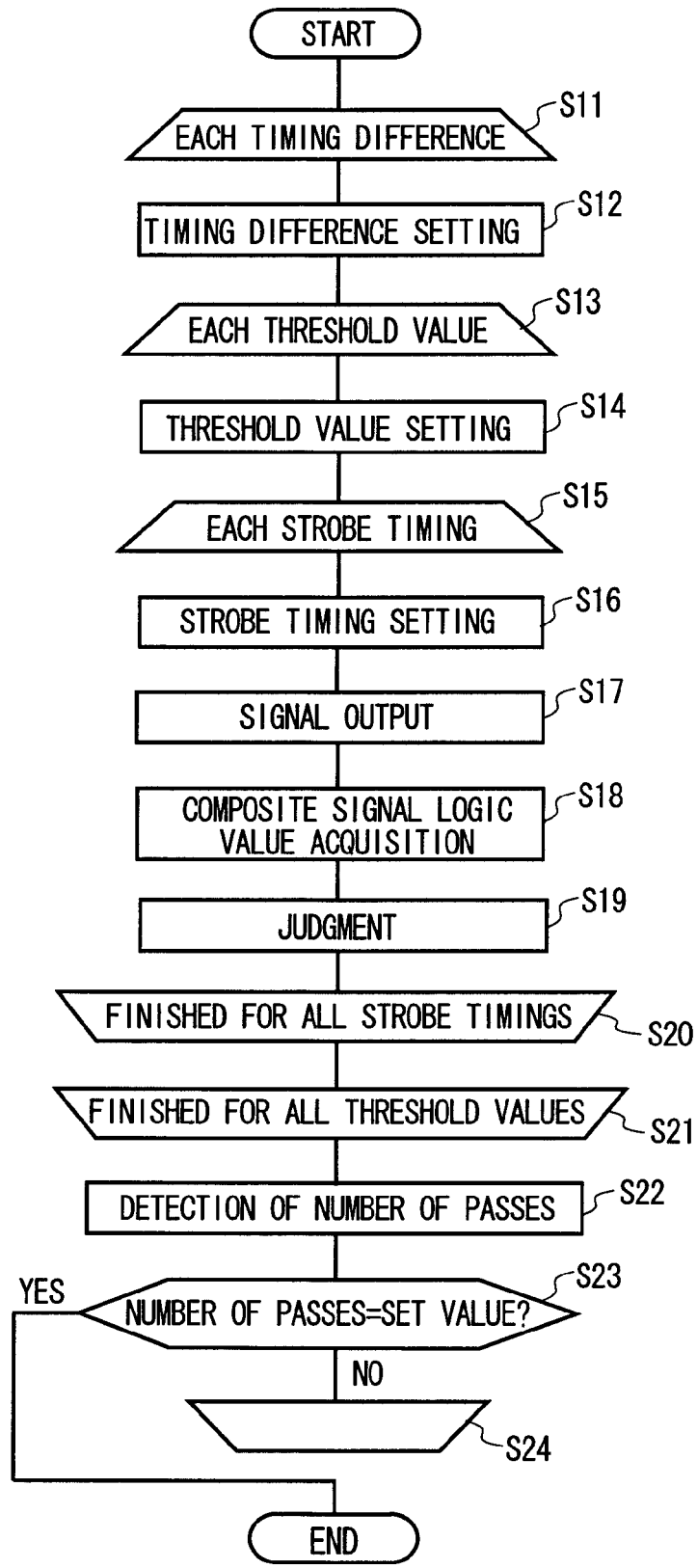
FIG. 12 shows an exemplary process flow of the adjustment apparatus 50 according to the present embodiment.

FIG. 12 shows an exemplary process flow of the adjustment apparatus 50 according to the present embodiment. The adjustment apparatus 50 performs the process from step S12 to step S23 each time the timing difference between the signal output timings of the first signal output section 31 and the second signal output section 32 is set (S11, S24).

First, at step S12, the adjustment apparatus 50 sets the timing difference between the signal output timings of the first signal output section 31 and the second signal output section 32. The adjustment apparatus 50 may sequentially change the signal output timing of one of the first signal output section 31 and the second signal output section 32 at each of a plurality of prescribed time intervals.

Next, the adjustment apparatus 50 performs the process from step S14 to step S20 for each threshold value (S13, S21). At step S13, the adjustment apparatus 50 sets the threshold value of the signal acquiring section 58. The adjustment apparatus 50 may sequentially change the threshold value for each prescribed level interval within the range between the logic L level and the logic H level.

Next, the adjustment apparatus 50 performs the process from step S16 to step S19 at each strobe timing (S15, S20). At step S16, the adjustment apparatus 50 sets the strobe timing of the signal acquiring section 58. The adjustment apparatus 50 may sequentially change the strobe timing for each prescribed time interval within the prescribed time range.

Next, at step S17, the control section 54 causes the first signal output section 31 to output a signal having a rising edge and causes the second signal output section 32 to output a signal having a falling edge, having therebetween the timing difference set at step S12. At step S18, the signal acquiring section 58 acquires, at the strobe timing set at step S16, a logic value obtained by comparing the level of the composite signal combined by the combining section 56 to the threshold value set at step S14.

At step S19, the judging section 60 judges whether the logic value acquired by the signal acquiring section 58 is the prescribed logic value. The judging section 60 stores the judgment result in the storage section 62.

At step S20, the adjusting section 64 judges whether processing has been completed for all of the strobe timings. If processing has been completed for all of the strobe timings, the adjusting section 64 proceeds to step S21. It should be noted that if the signal acquiring section 58 is a multi-strobe circuit that can acquire the logic value of the composite signal at a plurality of timings with a single acquisition process, the adjusting section 64 performs the process from step S16 to step S19 only once.

At step S21, the adjusting section 64 judges whether processing has been completed for all of the threshold values. If processing has been completed for all of the threshold values, the adjusting section 64 proceeds to step S22.

Next, at step S22, the adjusting section 64 detects the number of PASS points, i.e. the number of points at which the logic value of the composite signal compared to the threshold values at the prescribed level intervals at the strobe timings at prescribed time intervals within the prescribed time range matches the prescribed logic value.

At step S23, the adjusting section 64 judges whether the number of points indicating the prescribed logic value, i.e. the number of PASS points, is equal to the set value. The set value is not limited to representing points having a single value, and may instead represent a range of points. Specifically, in the examples of FIGS. 8 to 11, instead of 40 points, the set value may be a range from 38 points to 42 points.

When the number of PASS points matches the set value, the adjusting section 64 ends this process. If the number of PASS points does not match the set value, the adjusting section 64 returns to step S12 and repeats the processes from step S12 onward.

The adjustment apparatus 50 of the present embodiment can simply and accurately adjust the signal output timing of the signal having a rising edge output from the first signal output section 31 and the signal output timing of a signal having a falling edge output from the second signal output section 32. Therefore, when outputting a differential signal, for example, the adjustment apparatus 50 can simply and accurately cause the output timings to be the same for the signal output by the positive driver and the signal output by the negative driver.

Figure 13:
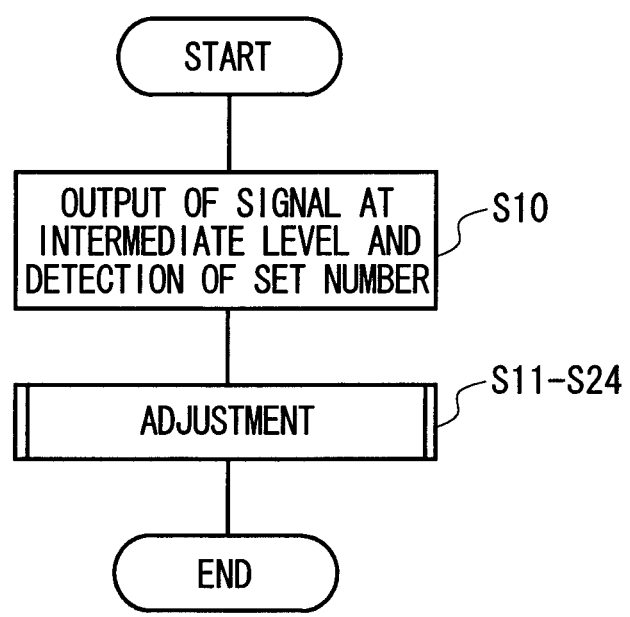
FIG. 13 shows a flow of a set number detection process and adjustment process.

FIG. 13 shows a flow of a set number detection process and adjustment process. Prior to the adjustment process according to steps S11 to S24 of FIG. 12, the adjusting section 64 performs a process for detecting the set number (step S10).

In the set number detection process (S10), first, the control section 54 supplies the signal acquiring section 58 with a signal at the intermediate level. For example, the control section 54 may supply the signal acquiring section 58 with the composite signal at the intermediate level by causing the first signal output section 31 to output a signal at the logic H level and the second signal output section 32 to output a signal at the logic L level. The control section 54 may output a signal at the intermediate level from one of the first signal output section 31 and the second signal output section 32.

The signal acquiring section 58 acquires the logic value of the signal at the intermediate level by comparing this signal to the threshold values at the designated level intervals within the designated level range at the designated timing intervals within the designated timing range. The adjusting section 64 detects the number of PASS points, which are points at which the logic value of the signal at the intermediate level acquired by the signal acquiring section 58 matches the prescribed logic value, and sets this number as the set number. As a result of this process, the adjusting section 64 can accurately detect the set number.

Figure 14:
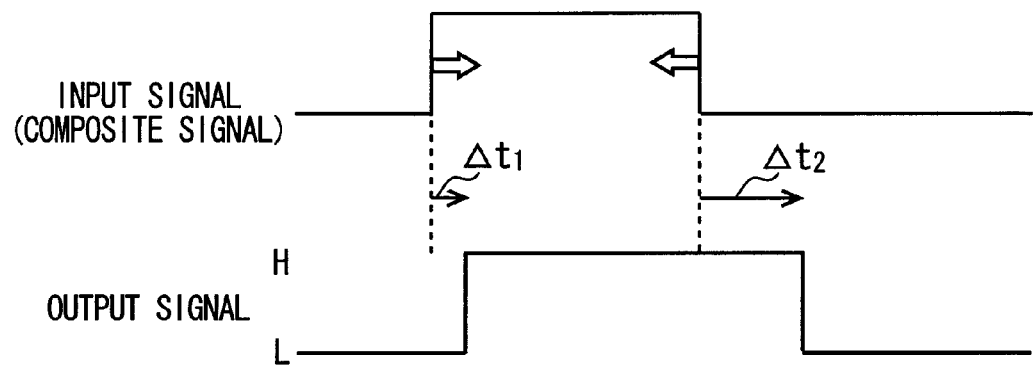
FIG. 14 shows an input signal and an output signal in a case where the rising response of the level comparator circuit 78 is faster than the falling response.
Figure 15:
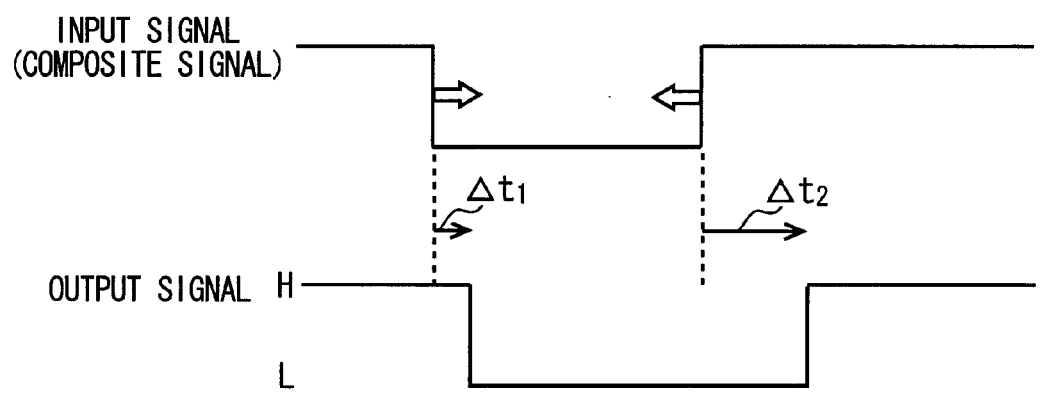
FIG. 15 shows an input signal and an output signal in a case where the falling response of the level comparator circuit 78 is faster than the rising response.

FIGS. 14 and 15 show exemplary pulsed input signals input to the level comparator circuit 78 within the signal acquiring section 36 and exemplary output signals from the level comparator circuit 78. More specifically, FIG. 14 shows an input signal and an output signal in a case where the rising response of the level comparator circuit 78 is faster than the falling response. FIG. 15 shows an input signal and an output signal in a case where the falling response of the level comparator circuit 78 is faster than the rising response.

When the rising response and the falling response of the level comparator circuit 78 are equal, as the pulse width of a pulsed input signal narrows, the trailing edge is input before the level comparator circuit 78 responds to the leading edge, and so the level comparator circuit 78 cannot respond to input signals below a certain pulse width. In such a case, it might be impossible to accurately match the signal output timings of the first signal output section 31 and the second signal output section 32.

Therefore, as shown in FIG. 14, when the rising response of the signal acquiring section 58 is earlier than the falling response, the adjusting section 64 adjusts the signal output timing of the first signal output section 31 to be later or adjusts the signal output timing of the second signal output section 32 to be earlier. In a similar way, as shown in FIG. 15, when the rising response of the signal acquiring section 58 is later than the falling response, the adjusting section 64 adjusts the signal output timing of the first signal output section 31 to be earlier or adjusts the signal output timing of the second signal output section 32 to be later.

As a result, the adjusting section 64 can prevent the level comparator circuit 78 from being unable to respond due to the trailing edge being input before the level comparator circuit 78 responds to the leading edge. Accordingly, the adjusting section 64 can more accurately adjust the signal output timings of the first signal output section 31 and the second signal output section 32.

Figure 16:
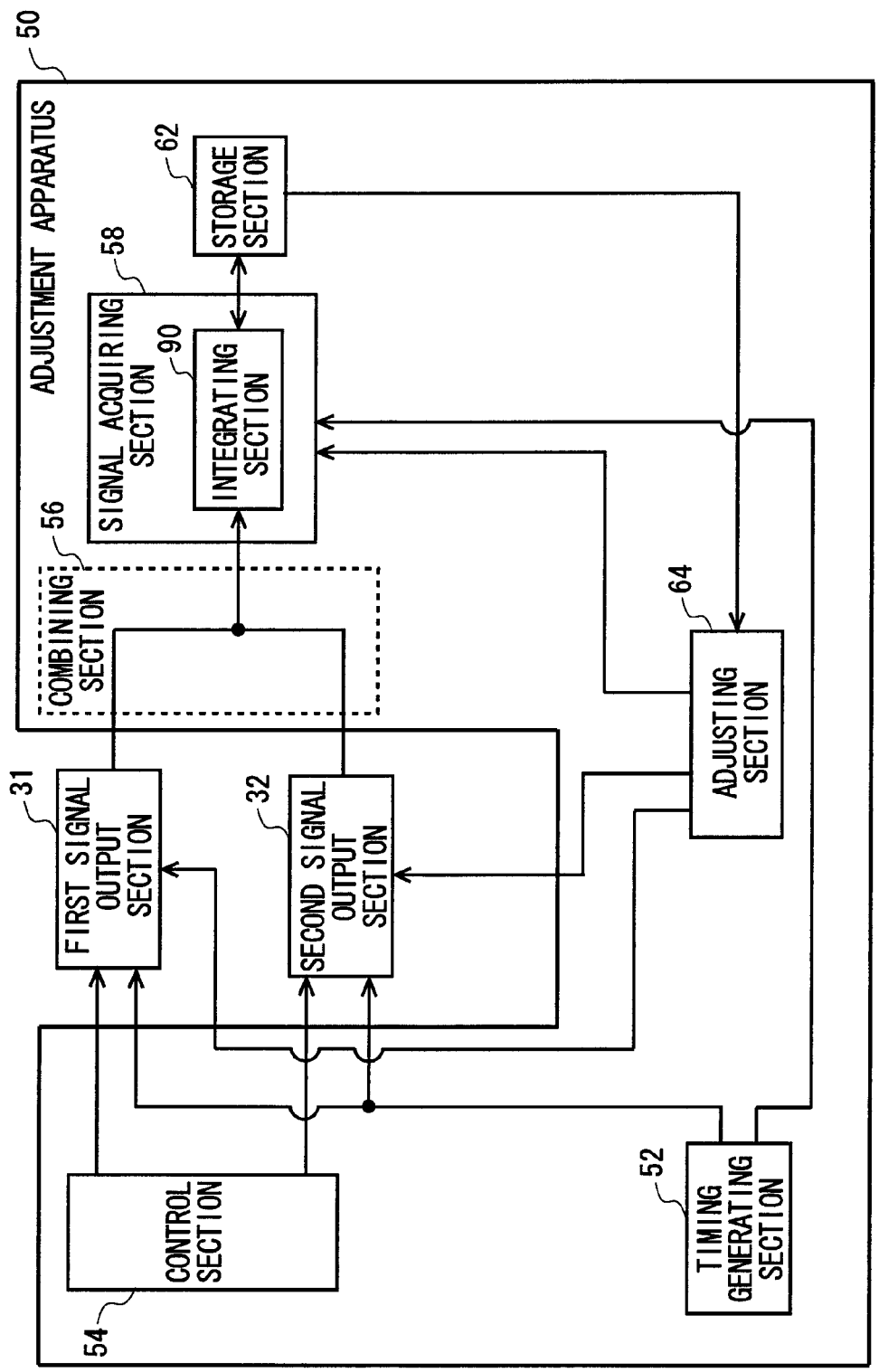
FIG. 16 shows a configuration of the adjustment apparatus 50 according to a first modification of the present embodiment.

FIG. 16 shows a configuration of the adjustment apparatus 50 according to a first modification of the present embodiment. The adjustment apparatus 50 according to the present modification adopts substantially the same function and configuration as the adjustment apparatus 50 shown in FIG. 2, and therefore components that are the same as those shown in FIG. 2 are given the same reference numerals and only differing points are included in the following description.

In the present modification, the signal acquiring section 58 includes an integrating section 90. Furthermore, the adjustment apparatus 50 need not include the judging section 60.

The integrating section 90 integrates the composite signal output by the combining section 56, over a designated time period. As a result, the signal acquiring section 58 can acquire an integrated value of the composite signal. The signal acquiring section 58 stores the acquired integrated value in the storage section 62. The integrating section 90 may set the integration time period according to a timing signal generated by the timing generating section 52.

The adjusting section 64 of the present modification adjusts the timing difference between the signal output timings of the first signal output section 31 and the second signal output section 32 such that the integrated value acquired by the signal acquiring section 58 becomes a predetermined value. For example, the adjusting section 64 may set this predetermined value to be equal to the integrated value obtained for a composite signal at the intermediate level, such as shown in FIG. 7. Prior to the adjustment process, the adjusting section 64 may detect the integrated value of the composite signal at the intermediate level and set this detected value as the predetermined value.

In the example shown in FIG. 5, the integrated value of the composite signal is greater than the predetermined value, and so the adjusting section 64 decreases the integrated value of the composite signal by causing the signal output timing of the first signal output section 31 to be later or by causing the signal output timing of the second signal output section 32 to be earlier. In the example shown in FIG. 6, the integrated value of the composite signal is less than the predetermined value, and so the adjusting section 64 decreases the integrated value of the composite signal by causing the signal output timing of the first signal output section 31 to be earlier or by causing the signal output timing of the second signal output section 32 to be later.

In the same manner as the adjustment apparatus 50 shown in FIG. 2, the adjustment apparatus 50 according to the present modification can simply and accurately adjust the signal output timing of the signal having a rising edge output from the first signal output section 31 and the signal output timing of a signal having a falling edge output from the second signal output section 32.

Figure 17:
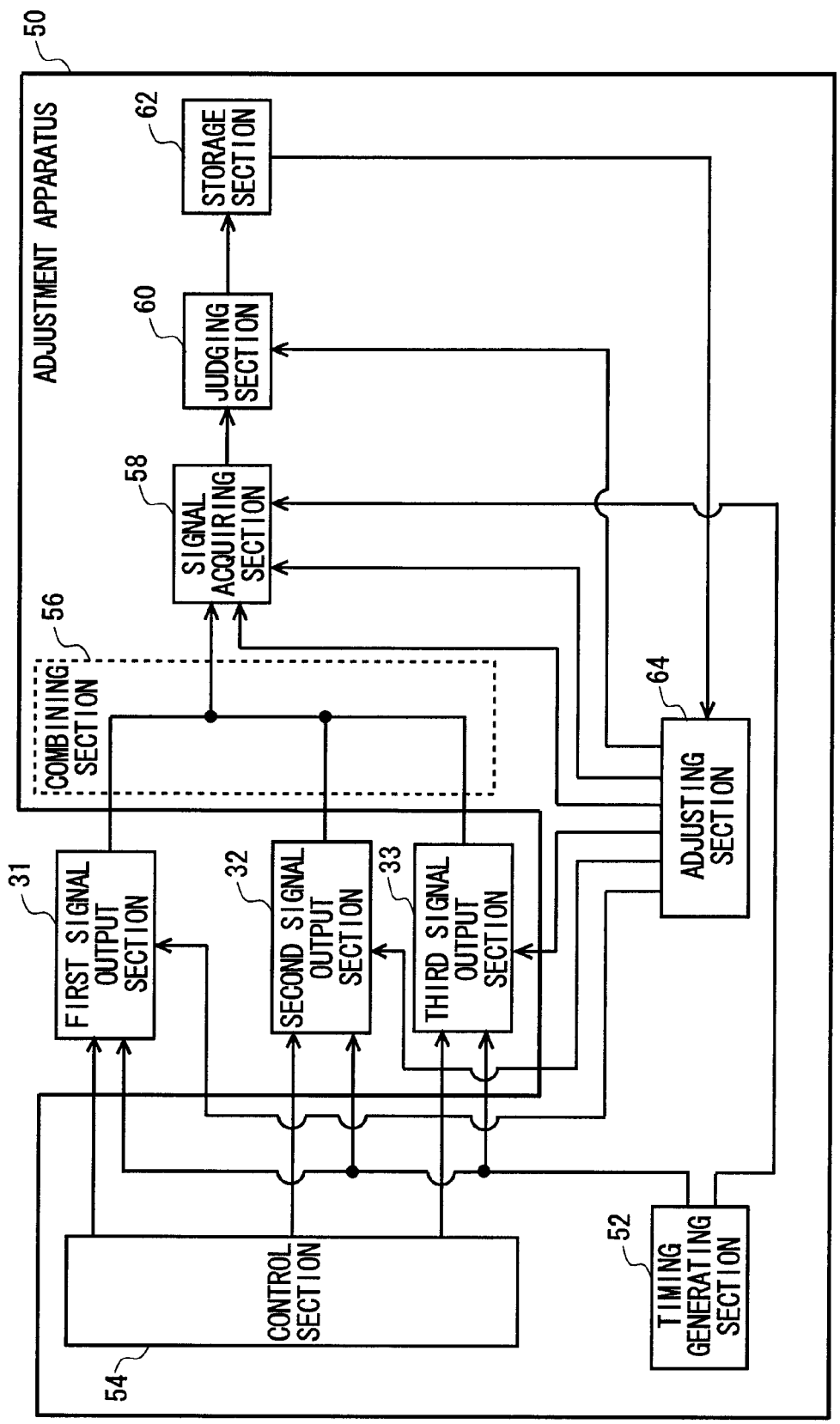
FIG. 17 shows a configuration of the adjustment apparatus 50 according to a second modification of the present embodiment.

FIG. 17 shows a configuration of the adjustment apparatus 50 according to a second modification of the present embodiment. The adjustment apparatus 50 according to the present modification adopts substantially the same function and configuration as the adjustment apparatus 50 shown in FIG. 2, and therefore components that are the same as those shown in FIG. 2 are given the same reference numerals and only differing points are included in the following description.

The adjustment apparatus 50 of the present modification can adjust the signal output timings of a rising edge and a falling edge in the first signal output section 31. In the present modification, the combining section 56 generates a composite signal by combining the signal output by the first signal output section 31, the signal output by the second signal output section 32, and a signal output by a third signal output section 33.

Figure 18:
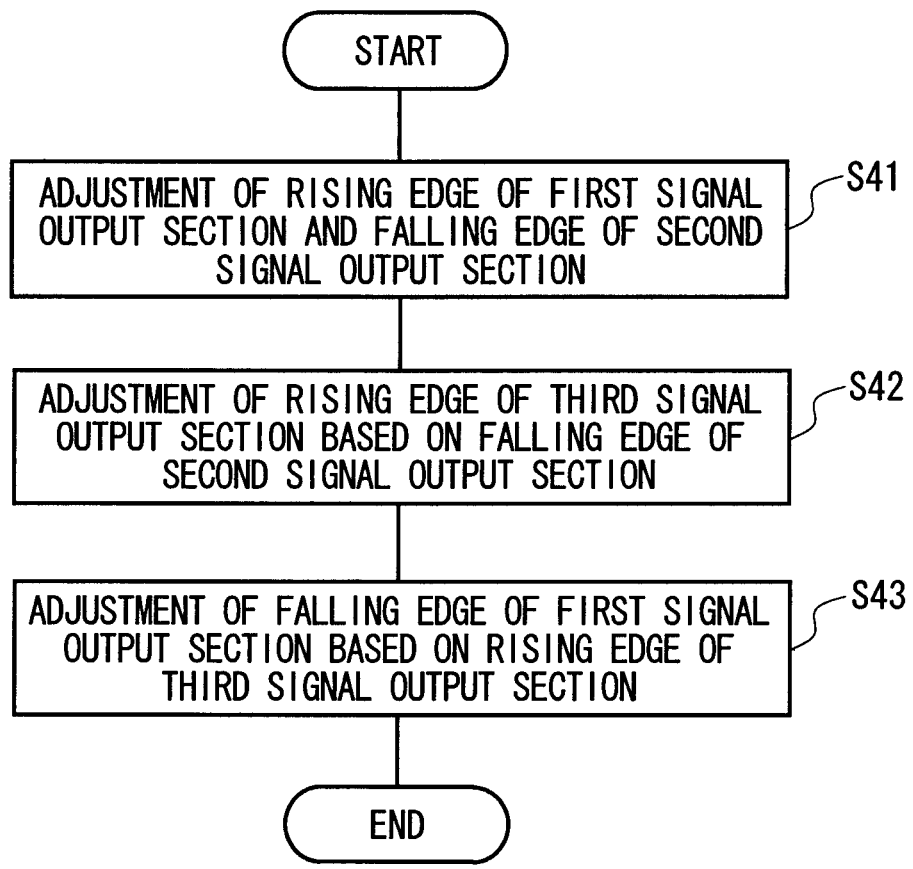
FIG. 18 shows a process flow of the adjustment apparatus 50 according to the second modification.

FIG. 18 shows a process flow of the adjustment apparatus 50 according to the second modification. First, at step S41, the adjustment apparatus 50 adjusts the signal output timing of the signal having a rising edge from the first signal output section 31 and the signal output timing of the signal having a falling edge from the second signal output section 32 such that these signal output timings are equal. In this case, the adjustment apparatus 50 performs the same adjustment process as described in FIG. 12.

Next, at step S42, the adjustment apparatus 50 adjusts the signal output timing of a signal having a rising edge from the third signal output section 33, based on the signal output timing of the signal having a falling edge from the second signal output section 32. In this case, the adjustment apparatus 50 fixes the signal output timing of the second signal output section 32 and changes the signal output timing of the signal having a rising edge from the third signal output section 33, in the same manner as the adjustment process shown in FIG. 12.

Next, at step S43, the adjustment apparatus 50 adjusts the signal output timing of the signal having a falling edge from the first signal output section 31, based on the signal output timing of the signal having a rising edge from the third signal output section 33. In this case, the adjustment apparatus 50 fixes the signal output timing of the third signal output section 33 and changes the signal output timing of the signal having a falling edge from the first signal output section 31, in the same manner as the adjustment process shown in FIG. 12. As a result of this process, the adjustment apparatus 50 of the present modification can adjust the signal output timing between the rising edge and the falling edge in the first signal output section 31.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An adjustment apparatus that adjusts signal output timings, comprising:
   a control section that causes a first signal out section to out nit a signal having a rising edge and causes a second signal output section to output a signal having a falling edge;
   a signal acquiring section that acquires a composite signal obtained by combining the signal output by the first signal output section and the signal output by the second signal output section; and
   an adjusting section that adjusts a timing difference between a signal output timing of the first signal output section and a signal output timing of the second signal output section, such that the signal acquiring section acquires the composite signal having a composite waveform in which a component of the composite waveform due to the rising edge and a component of the composite waveform due to the falling edge overlap, wherein
   the signal acquiring section acquires logic values of the composite signal at a plurality of different timings, and
   the adjusting section judges whether the composite signal having the composite waveform in which the components overlap has been acquired, based on the logic values of the composite signal acquired at the plurality of timings.

2. The adjustment apparatus according to claim 1, wherein
   the signal acquiring section acquires the logic values of the composite signal by comparing the composite signal to a plurality of different threshold values, and
   the adjusting section judges whether the composite signal having the composite waveform in which the components overlap has been acquired, based on the logic values of the composite signal acquired by the comparison to the plurality of threshold values.

3. The adjustment apparatus according to claim 1, wherein
   the control section causes the first signal output section and the second signal output section to output the signal having the rising edge and the signal having the falling edge at a designated level and with a designated timing difference therebetween,
   the signal acquiring section acquires logic values of the composite signal by comparing the composite signal to a plurality of different threshold values at a plurality of different timings, and the adjusting section (i) detects points at which the logic, values acquired by the comparison to the plurality of threshold values at the plurality of timings become predetermined logic values and (ii) adjusts the timing difference between the signal output timing of the first signal output section and the signal output timing of the second signal output section such that a number of the points becomes a predetermined set number.

4. The adjustment apparatus according to claim 3, wherein when the composite signal at an intermediate level between a logic H level and a logic L level is compared to the plurality of threshold values at the plurality of timings, the adjusting section sets the set number to be the number of points that indicate a predetermined logic value.

5. The adjustment apparatus according to claim 4, wherein, prior to the adjustment,
the control section supplies the signal acquiring section with a signal at the intermediate level,
the signal acquiring section acquires logic values of the signal at the intermediate level by comparing the signal at the intermediate level to the plurality of threshold values at the plurality of timings, and
the adjusting section sets the set number to be the number of points at which the logic value of the signal at the intermediate level is the predetermined logic value.

6. The adjustment apparatus according to claim 1, wherein
the signal acquiring section acquires an integrated value of the composite signal, and
the adjusting section adjusts the timing difference between the signal output timing of the first signal output section and the signal output timing of the second signal output section such that the integrated value becomes a predetermined value.

7. The adjustment apparatus according to claim 1, wherein
when a rising response of the signal acquiring section is earlier than a falling response, the adjusting section adjusts the signal output timing of the first signal output section to be later or adjusts the signal output timing of the second signal output section to be earlier, and
when the rising response of the signal acquiring section is later than the falling, response, the adjusting section adjusts the signal output timing of the first signal output section to be earlier or adjusts the signal output timing of the second signal output section to be later.

8. The adjustment apparatus according to claim 1, wherein the adjusting section
adjusts the signal output timing of the signal having the rising edge in the first signal output section and adjusts the signal output timing of the signal having the falling edge in the second signal output section,
adjusts a signal output timing of a signal having a rising edge in a third signal output section, based on the signal output timing of the signal having the falling edge in the second signal output section, and
adjusts the signal output timing of the signal having the falling edge in the first signal output section, based on the signal output timing of the signal having the rising edge in the third signal output section.

9. A test apparatus that tests a device under test, comprising:
the adjustment apparatus according to claim 1;
the first signal output section; and
the second signal output section, wherein
the signal output by the first signal output section and the signal output by the second signal output section are for testing the device under test.

* * * * *